United States Patent [19]

Ronemus et al.

[11] Patent Number: 4,567,544

[45] Date of Patent: Jan. 28, 1986

[54] PLUG-IN GROUND FAULT CIRCUIT INTERRUPTER MODULE

[75] Inventors: DeHertburn N. Ronemus, North Syracuse; Victor M. Tice, Manlius, both of N.Y.

[73] Assignee: Pass & Seymour, Inc., Solvay, N.Y.

[21] Appl. No.: 539,154

[22] Filed: Oct. 5, 1983

[51] Int. Cl.[4] .............................................. H05K 5/06

[52] U.S. Cl. ................................ 361/399; 174/52 S; 361/394; 361/395

[58] Field of Search .......................... 200/51 R, 302.1; 174/52 S, 65 SS; 361/392, 394, 395, 399, 42–50; 335/18

[56] References Cited

U.S. PATENT DOCUMENTS

| | | | |
|---|---|---|---|
| 2,963,536 | 12/1960 | Kokalas | 174/65 SS |
| 3,055,972 | 9/1962 | Peterson | 174/65 SS |
| 3,104,299 | 9/1963 | Koci et al. | 200/302.1 |
| 3,667,783 | 6/1972 | Sotolongo | 174/65 SS |
| 3,904,812 | 9/1975 | Daffron | 361/395 |
| 4,001,647 | 1/1977 | Klein et al. | 361/42 |
| 4,013,929 | 3/1977 | Dietz et al. | 335/18 |
| 4,295,179 | 10/1981 | Read | 361/399 |
| 4,378,579 | 3/1983 | Hudson, Jr. | 361/42 |
| 4,464,582 | 8/1984 | Aragaki et al. | 361/42 |

FOREIGN PATENT DOCUMENTS

| | | | |
|---|---|---|---|
| 2045539 | 10/1980 | United Kingdom | 361/395 |

*Primary Examiner*—A. D. Pellinen

*Assistant Examiner*—Gregory D. Thompson

*Attorney, Agent, or Firm*—Charles S. McGuire

[57] ABSTRACT

Ground fault circuit interrupter components, including a fault-sensing circuit and a relay, are enclosed within a housing having terminals for connection of the wires of a line cord extending from an electrical appliance or other electrical load for which ground fault protection is provided. Standard plug blades extend from the housing for insertion into a conventional electrical receptacle to connect the load to a source of electrical power, the circuit interrupter components being interposed between the wire connection terminals and the blades. The housing configuration and assembly provides an essentially waterproof enclosure for all elements between the line cord and plug blades which is preferably divided into two discrete compartments, one containing the wire connection terminals and the other the GFCI components. Thus, if the one compartment should develop a leak, the water-tight integrity of the other is still maintained. The line cord extends into the module through a resilient sealing grommet which may conveniently be interchanged with different size grommets to accommodate line cords of various diameters without changing any other components of the module. Assembly is simplified and facilitated by providing a one-piece body member, open at both ends, and connecting all other components as a single assembly for insertion into the body and fastening with screws at each end to sealably close the body openings.

6 Claims, 8 Drawing Figures

PLUG-IN GROUND FAULT CIRCUIT INTERRUPTER MODULE

BACKGROUND OF THE INVENTION

The present invention relates to the physical housing or packaging of the class of electrical apparatus known as ground fault circuit interrupters (GFCI). More particularly, the invention relates to a module having terminal means for direct connection of the wires of a power cord from an electrical appliance, or the like, and a plug for insertion in a standard jack or receptacle, with GFCI means housed within the module and interposed between the terminals and plug.

The possibility of injury and/or damage which is inherent in the operation of any electrical system of significant magnitude has led to the provision of various protective devices. Among these are the class of electrical apparatus which has come to be known as ground fault circuit interrupters (GFCI). In general, such apparatus senses and/or responds to a condition in a line carrying electrical current which indicates a presently or imminently dangerous condition, such as the presence of a current path other than the intended path of normal operation. Response to the sensed dangerous condition may be in the form of alarm actuation and/or opening the line (interrupting the circuit) between the source of power and the load.

In general, GFCI equipment has been provided in a form suitable for mounting in the conventional circuit breaker panel box at the input to the electrical distribution system of a building, in conjunction with electric receptacles in ordinary household or trade size junction boxes, and in separate, transportable boxes or housings having receptacle means for detachable connection of the line cord from a load and additional means for connecting the box to a power source. Although the latter type of GFCI may be moved from place to place, and thus used in locations not provided with permanently installed GFCI devices, there is always the possibility of situations where an electrical appliance or other load must be connected to a power source and ground fault protection should be provided but is not available.

The principal object of the present invention is to provide GFCI protection which is connected directly to the associated piece of equipment (load) in an essentially permanent manner, whereby ground fault protection is provided simply by connecting the load to the power line.

More specifically, it is an object of the invention to provide a module having both terminals for connection of the wires of a line cord from a load and a standard plug for insertion in a receptacle connected to a power source with a GFCI device interposed therebetween and housed within the module.

A further object is to provide a plug-in module for connection at the end of a line cord and enclosing a ground fault protective device in an essentially waterproof housing.

Another object is to provide a plug-in module having terminals for connection of the wires of a line cord within a first compartment and a complete GFCI protective device within a second compartment of housing means providing separate, essentially water-tight capability for the two compartments.

A still further object is to provide a plug-in module adapted to receive the end of a line cord in sealing engagement with water-proof housing means which also encloses GFCI equipment and which will accommodate line cords of various diameters by changing only a single component.

Still another object is to provide GFCI equipment in a novel physical configuration, facilitating its assembly with housing means to form a module incorporating a plug for insertion in a standard electrical receptacle and adapted to be packaged and sold as a separate item for installation on the end of a line cord by anyone having basic familiarity with cords and plugs, not necessarily a skilled electrician.

Other objects will in part be obvious and will in part appear hereinafter.

SUMMARY OF THE INVENTION

In accordance with the foregoing objects, the invention contemplates a module incorporating housing means containing all elements of a GFCI device, including a relay having contacts interposed in the power line between an electrical power source and load, and means for sensing fault conditions in the line and operating the relay to open the line in response thereto. The housing means includes a one-piece body member, open at the ends. A printed circuit board carries the fault sensing and relay operating components and is physically connected to the relay and to the plug assembly only by wires extending between connections at one end to circuit board terminals and at the other to relay or plug terminals.

A cover assembly includes a wall molded about three conductors extending therethrough between terminals on one side for connection of the wires from a line cord and on the other for connection to a pair of fixed relay contacts and the plug assembly. The line conductors extend from the movable pair of relay contacts to the plug assembly, through the cores of differential transformers on the circuit board providing the fault sensing means. The composite assembly of cover, relay, printed circuit board and plug, with interconnecting wiring, is inserted into the one-piece body through the opening in one end until the blades of the plug assembly extend through the opening at the other end. Sealing means, such as gaskets and O-rings, are provided for essentially water-tight engagement of the cover and plug assemblies with the body about the two openings therein when the two assemblies and body are connected by threaded fasteners.

The terminals on the opposite side of the cover assembly from the body member are surrounded by an externally threaded collar, formed integrally with the cover assembly and having cut-out areas for access to the terminals. An internally threaded cap, having a central opening in the end, is threaded on the collar to engage a sealing O-ring. The line cord from an electrical appliance or other load is passed through an opening in a resilient grommet in sealing engagement therewith, the grommet being positioned in the opening of the cap and also urged into sealing engagement with the latter by a spacer member which holds the grommet and is seated on the collar when fully assembled. After the line cord is passed through the grommet, the bare ends of the line cord wires are secured to the terminals on the cover element and the cap is then securely threaded on the collar. The module thus comprises housing means divided into two compartments, each having independent, essentially water-proof integrity.

DETAILED DESCRIPTION

Figure 1:
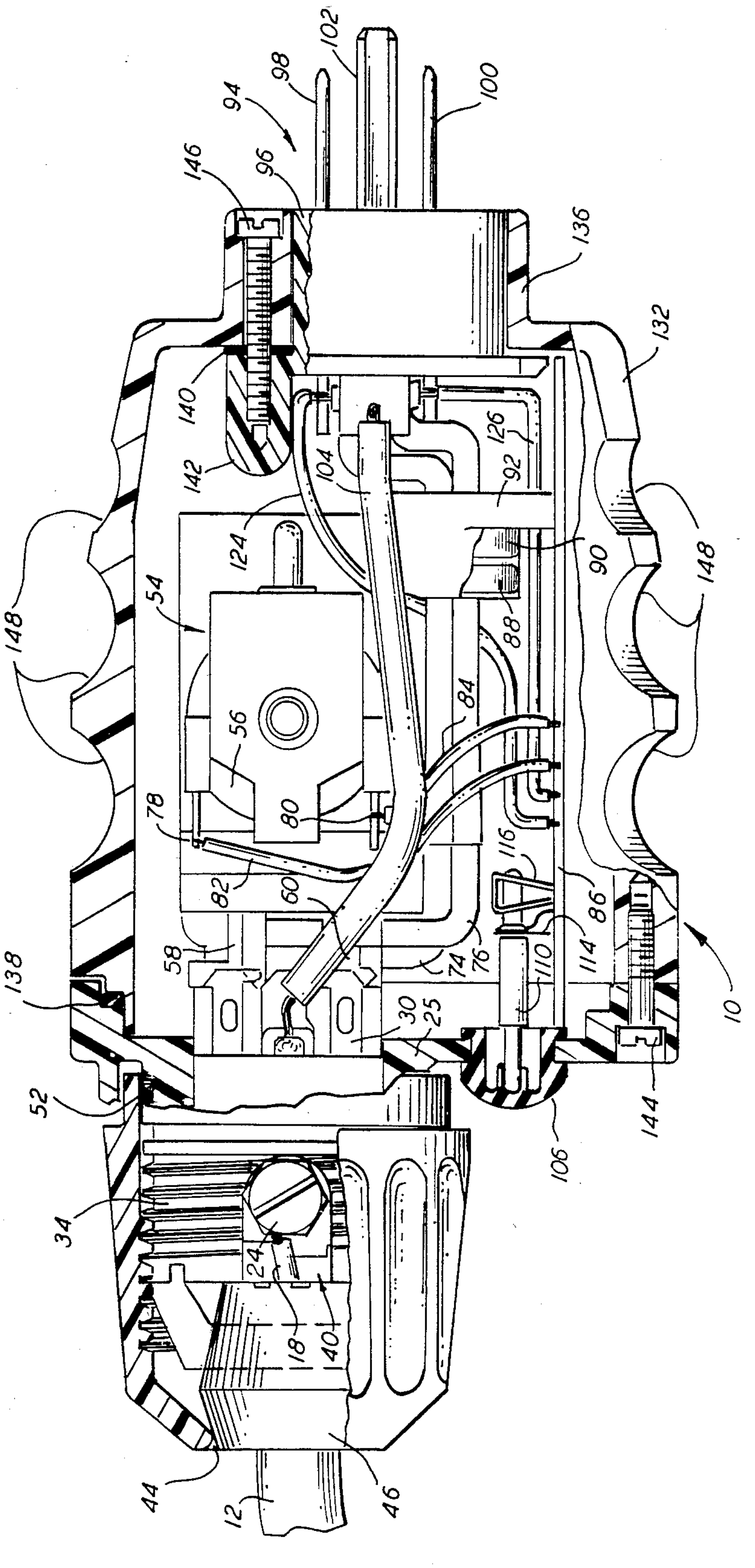
FIG. 1 is a side elevational view, partly in section on the line 1—1 of FIG. 6, of the ground fault interrupter module of the invention.
Figure 2:
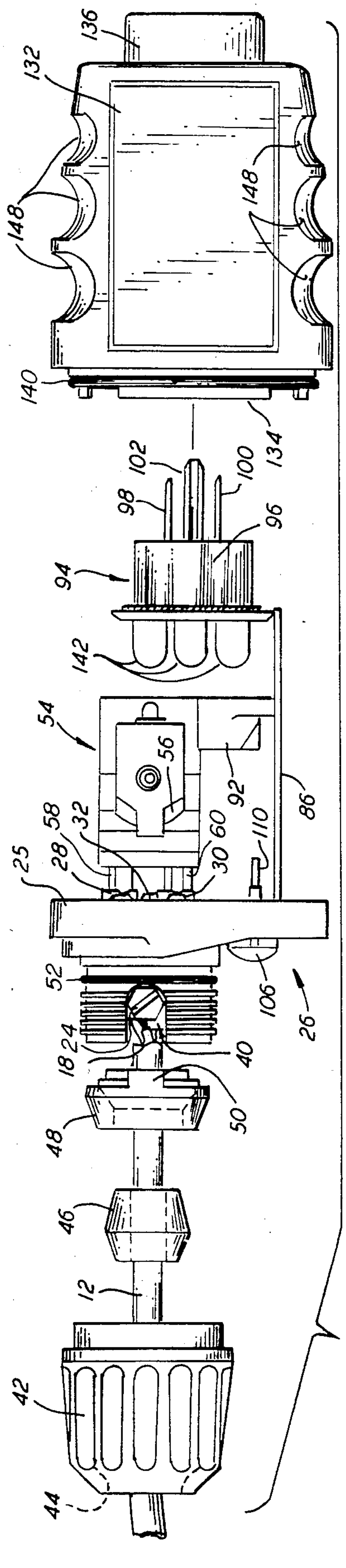
FIG. 2 is an exploded side elevational view thereof, with portions of the wiring omitted.

Referring now to the drawings, a preferred embodiment of the invention illustrated therein is shown in FIGS. 1 and 2, respectively, in fully and partly assembled forms. The complete unit is termed a plug-in module and denoted generally by reference numeral 10. Module 10 is provided in a form suitable for direct connection of a conventional, insulated line cord or cable from an electrical appliance or other load which is to be connected to a source of electrical power source, e.g., a 120 volt, 60 hertz, single phase, AC power distribution system, and for insertion in a standard receptacle to provide such connection. A fragment of line cord 12 is shown in FIGS. 1 and 2 and, in the illustrated embodiment, includes three wires or conductors, each separately insulated and designated as hot, neutral and ground conductors 14,16 (FIG. 4) and 18 (FIGS. 1 and 2), respectively.

Figure 4:
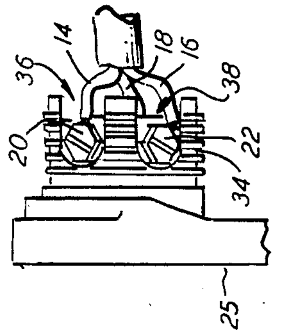
FIG. 4 is a fragmentary, side elevational view of a portion of the module, seen from the side opposite that shown in FIGS. 1 and 2.

The insulation is removed from end portions of conductors 14, 16 and 18 and the bare wires are securely held in contact with respective terminals of module 10 by screws 20,22 and 24, respectively, the former two being shown in FIG. 4 and the latter in FIGS. 1 and 2. The terminals to which conductors 14,16 and 18 are attached constitute the respective outer end portions of conducting strips or bars which extend through wall 25 of cover assembly 26 to inner ends 28,30 and 32, in sealed engagement, preferably by being incorporated directly in a plastic injection molding which comprises the cover assembly wall. Formed integrally with wall 25 and extending forwardly therefrom is circular collar 34, having molded external threads. Three cut-out portions 36,38 (FIG. 4) and 40 (FIGS. 1 and 2) are provided in collar 34, without disturbing the symmetrical continuity of the threads, to provide access to screws 20,22 and 24 and easy connection of the individual wires of line cord 12 to the respective terminals of module 10. Standard ring or spade terminals may, of course, be provided on the wire ends to facilitate attachment.

A generally dome-shaped cap 42 is preferably formed as an injection molded plastic part, and includes an internally threaded portion for engagement with the external threads on collar 34. Line cord 12 is passed through an opening bounded by lip 44 on the end of cap 42, and through a central opening in grommet 46 which is of rubber or other resilient material, the grommet opening being equal to or slightly smaller than the diameter of line cord 12, whereby the latter is in frictional, sealing engagement with the grommet. Annular spacer 48 includes tab 50 extending from an edge portion thereof for seating in cut-out area 40 of collar 34, and two similar tabs for seating in cut-out areas 36 and 38. Line cord 12 also passes through spacer 48 for attachment of the wires to the terminals of cover assembly 26, as indicated in FIG. 2. Spacer 48 is then seated on collar 34, grommet 46 is pushed along the cord until it seats against spacer 48 and cap 42 is threaded on collar 34, the configuration and dimensions of the elements being such that grommet 46 is firmly engaged between spacer 48 and lip 44 of cap 42 when the latter is securely threaded on the collar. Resilient O-ring 52 is positioned in a groove on collar 34, between the threaded portion and wall 25, to extend outwardly from the collar for sealing engagement with cap 42, as indicated in FIG. 1. Thus, when the elements are fully assembled in the manner indicated, an essentially water-tight compartment is provided by the sealing engagement of grommet 46 with line cord 12 and cap 42, and the seal provided by O-ring 52 between collar 34 and cap 42, thereby protecting the bare ends of the line cord wires and associated terminals from a wet or moist environment wherein module 10 may be employed.

Figure 5:
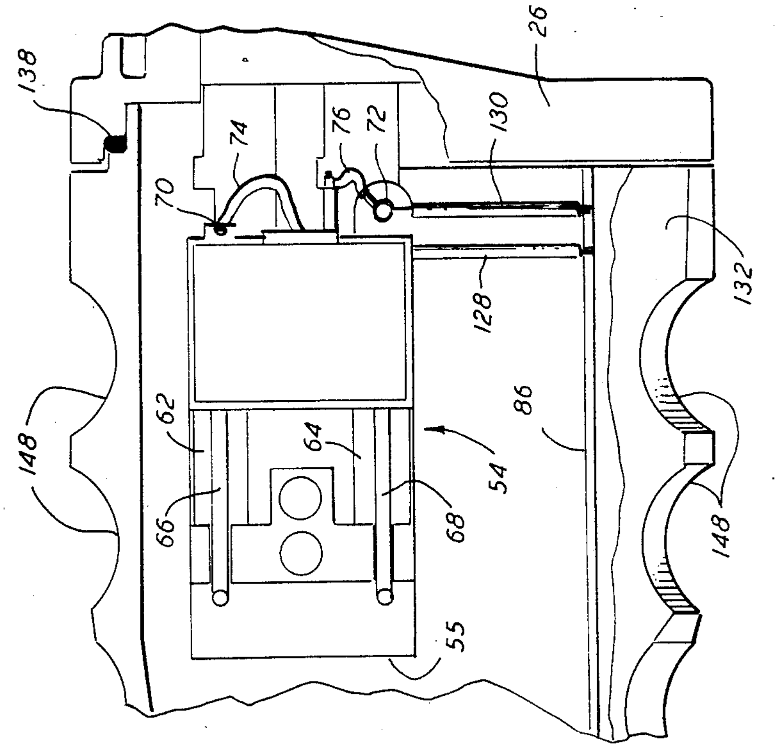
FIG. 5 is an enlarged, fragmentary, side elevational view, with portions broken away, seen from the same side as FIG. 4.

Conventional electro-mechanical relay assembly 54 includes a first pair of fixed contacts and a second pair of contacts mounted upon rocker arm 55 (FIG. 5) for conjoint movement between spaced and contacting positions with respect to the first pair of contacts. The rocker arm is biased by a spring urging the movable contacts to the spaced position, relay coil 56 being energized to move the arm to close the two pairs of contacts. Terminals 58 and 60 extend from the fixed contacts of relay assembly 54 and are connected in electrically conducting relation to the ends of conducting strips 28 and 30, respectively, placing the fixed relay contacts in communication with hot and neutral wires 14 and 16, respectively, of line cord 12.

The movable contacts of relay assembly 54 are mounted on copper strips 62 and 64, which are supported by and movable with rocker arm 55. Wires 66 and 68, also forming part of the conventional relay assembly, extend from connections with strips 62 and 64, respectively, to terminals 70 and 72, providing electrical communication of the movable relay contacts with conductors 74 and 76. The input and output sides of relay coil 56 are connected at 78 and 80 (FIG. 1) to wires 82 and 84, which are connected at their opposite ends to respective terminals of printed circuit board 86.

The fault sensing means is provided by a pair of differential transformers formed by wound toroids 88 and 90 with conductors 74 and 76 passing therethrough. A first of the transformers is adapted to sense ground faults on the load side of module 10 which produce an imbalance in the normally equal current flow through conductors 74 and 76, forming single-turn primaries of the transformer, thereby including current flow in the secondary, i.e., the winding on the toroid. The other transformer provides the desired operation when the neutral line is grounded on the load side, the toroid winding in this case comprising the primary and conductors 74 and 76 the secondaries. Both sides of the two toroid windings are connected to appropriate terminals on circuit board 86 by means of wires extending through plastic holder 92.

Plug assembly 94 includes injection molded plastic body 96 with standard plug blades 98,100 and 102 extending therethrough in sealed engagement, preferably by being molded directly into the plug assembly. Conductors 74 and 76 are connected directly to blades 98 and 100, respectively, on one side of plug body 96, the blade portions on the opposite side being adapted and intended for insertion in the female connectors of a standard electrical receptacle to be thus connected to a source of AC power. Wire 104 is connected at opposite ends directly between end 32 of the conducting strip to which line cord conductor 18 is connected, and to blade 102 on one side of the plug body, the portion of blade 102 extending on the opposite side being intended for insertion in the grounding connector of the receptacle. Blade 102 is in the common U-shape configuration of ground connectors, but may, of course, take any desired form to comply with the type of receptacle with which module 10 is intended to be used. Likewise, while blades 98 and 100 are shown in parallel configuration (see FIG. 3), they may be perpendicular, if desired, to fit receptacles of such configuration.

Circuit board 86 carries all components such as capacitors, resistors, diodes, etc. employed in the circuitry which operates to energize coil 56 when module 10 is connected to a power source, thereby connecting the source to the load, and to de-energize the coil and open (interrupt) the circuit between source and load in response to a sensed ground fault or grounded neutral line. Although for purposes of the present invention, any of a number of fault responsive means may provide the circuit interrupting function, a particularly advantageous form suitable for incorporation with the present invention is disclosed in copending application Ser. No. 539,153, filed of even date herewith and assigned to applicant's assignee.

Figure 8:
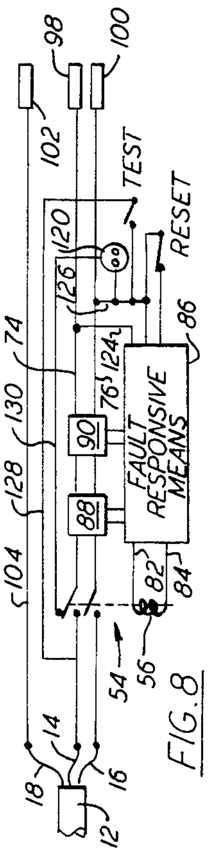
FIG. 8 is a schematic circuit diagram.
Figure 7:
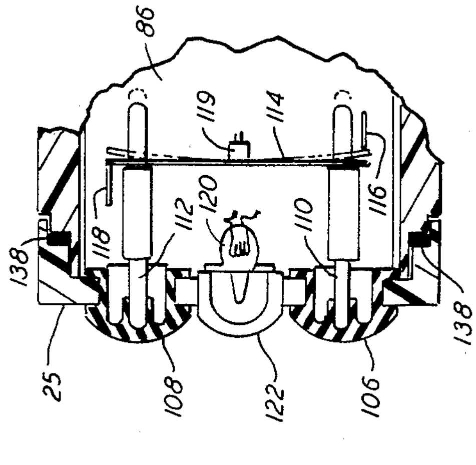
FIG. 7 is a fragmentary, top plan view in section on the line 7—7 of FIG. 6.
Figure 6:
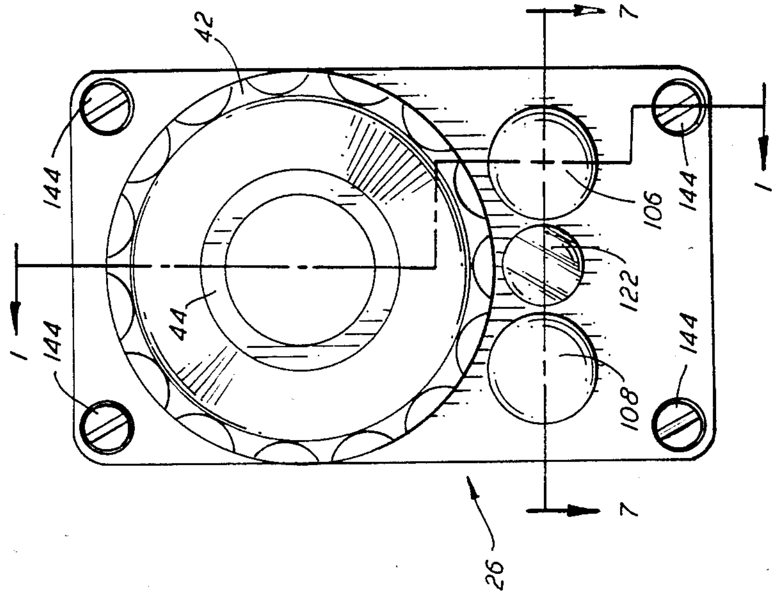
FIG. 6 is a front elevational view.

Selectively operable electrical switches are provided for testing the fault responsive circuit interrupting means for proper operation, and for resetting the components to their original condition prior to the fault testing. The manually engageable and movable portions of the test and reset switches are incorporated in cover assembly 26, constituting flexible rubber boots 106 and 108 which are press fitted in openings in wall 25, as best seen in FIGS. 6, 7 and 8. Boots 106 and 108 carry push rods 110 and 112, respectively, having a central portion of larger diameter than the ends. The small diameter ends of push rods 110 and 112 opposite those engaged in the boots extend loosely through respective openings formed for such purpose in conducting spring strip 114.

Pins 116 and 118 are mounted upon circuit board 86 for connection in the electrical circuits of the test and reset switches. The normal, unflexed position of spring strip 114 is shown in solid lines in FIG. 7. Strip 114 is supported in a central area, substantially midway between its ends, upon circuit board 86 by solder connection 119 which also electrically connects strip 114 to terminals on the board. Strip 114 is supported with one end normally spaced from pin 116 and the other end to contact with pin 118. Pin 116 and the adjacent end of strip 114 form the contacts of the test switch, movable to the closed position by manual depression of boot 106 to move push rod 110, thereby flexing the end of strip 114 to the dotted line position, in contact with pin 116. The electrical effect of closing the test switch is explained in more detail in aforementioned application Ser. No. 539,153, as well as application Ser. No. 539,155, also filed of even date herewith and assigned to applicant's assignee, and dealing specifically with the structure and operation of the test and reset switches.

One effect is that proper operation of the GFCI upon closing the test switch provides power to illuminate lamp 120, also supported upon and connected to circuit board 86. Glass or transparent plastic window or lens 122 is press fitted or molded directly into an opening in wall 25 of cover assembly 26 between boots 106 and 108 to render lamp 120 visible, indicating to an operator proper action of the GFCI upon pressing boot 106 to close the test switch. In order to resume normal operation of the GFCI, it is necessary to discharge a charged capacitor which is accomplished, as fully explained in the two aforementioned applications, by opening the reset switch, i.e., by moving the adjacent end of strip 114 away from pin 118 to the dotted, line position of FIG. 7, by pressing boot 108 and moving push rod 112.

After connection of the previously described elements in the indicated manner, cover assembly 26, relay assembly 54, circuit board 86 and plug assembly 94, with associated wiring, are relatively interconnected and supported as a single unit. In addition to wires 82 and 84, extending between connections on circuit board 86 and relay assembly 54, wires 124 and 126 (FIG. 1) connect the hot and neutral sides of the AC power source to the circuit board, and wires 128 and 130 (FIG. 5) connect one side of the test switch (pin 116) and lamp 120, respectively, on the circuit board with the hot lead, through the relay contacts, as also described more fully in the aforementioned copending applications.

Thus, a total of six wires are connected at one end to circuit board 86, two of which (82 and 84) are connected at the other end to coil 56 of relay assembly 54, two (124 and 126) to plug assembly 94, and two (128 and 130) to terminals communicating with the relay contacts. In addition, conductors 74 and 76 extend directly between connections on the cover and plug assemblies, passing through toroids 88 and 90, and wire 104 extends directly between connections to terminals on the cover and plug assemblies. Relay assembly 54 is supported with respect to cover assembly 26 by more or less rigid connectors extending between blade connectors on the two. Circuit board 86 is supported only by wired connections to cover, relay and plug assemblies 26,54 and 94, respectively, although guide or positioning means are preferably provided for locating the front end of board 86 with respect to cover assembly 26 and push rods 110 and 112 from the cover assembly pass through strip 114 which is connected to the circuit board. Plug assembly 94 is connected to the other subassemblies and physically supported with respect thereto only by the wired connections.

The four major sub-assemblies (cover 26, relay 54, circuit board 86 and plug 94) being thus interconnected and relatively supported, are assembled with hollow, one-piece body member 132, enclosed on four sides and having openings at each end. A relatively large opening at one end is bounded by flange 134 and a smaller opening at the other end by protruding collar 136. The assembled elements are inserted through the larger opening, after placing resilient O-ring 138 about flange 134 and gasket 140 on plug body 96, until flange 134 is inserted in cover assembly 26 and plug body 96 is inserted in the small opening in collar 136 of body member 132.

Figure 3:
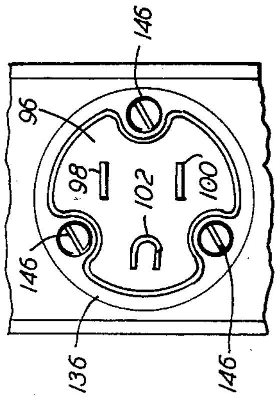
FIG. 3 is a fragmentary, rear elevatinal view.

Four openings are provided through cover assembly 26 near the corners which are aligned with four internally threaded openings in body member 132 when module 10 is fully assembled. Also, as seen in FIG. 3, the opening defined by collar 136 includes three internally lobed portions which mate with three grooved portions in plug body 96. Openings in the three lobed portions of collar 136 are aligned, in the assembled condition, with internally threaded openings in screw receptacles 142. Screws 144 are then inserted through the openings in cover assembly 26 and threaded securely to body member 132, compressing O-ring 138 into sealing engagement between the cover and body entirely about the larger opening therein. Screws 146 are likewise inserted through the openings in collar 136 and fastened in the threaded openings in receptacles 142, thereby compressing gasket 140 between plug body 96 and an internal surface of collar 136 (FIG. 1).

FIG. 8 illustrates a general circuit diagram of module 10, using reference numerals applied to previously described elements. The circuitry comprising the fault responsive means is carried and interconnected by circuit board 86 and is therefore designated by that number in FIG. 8. Again, for complete details of construction and operation of the electrical portion of the GFCI, reference may be had to either or both of the aforementioned copending applications. All of the six wires (82,84,124,126,128,130) connecting the circuit board 86 to terminals on relay assembly 54 and/or conductors 74 and 76 are shown, as well as ground wire 104. The test and reset switches and lamp 120 are shown separately from circuit board 86, although actually mounted thereon.

From the foregoing description, it will be apparent that module 10 provides all the stated objects and advantages of the invention, comprising a unitary device adapted for connection thereto of the individual hot, neutral and ground wires of a line cord and for plugging into a standard receptacle outlet. Body member 132 is formed on two opposite sides with finger grip portions 148 to facilitate grasping module 10 for insertion into or withdrawal from a standard receptacle. A substantially water-tight housing is provided for all components of the GFCI module, with the line cord extending from one end and the connector blades of the plug from the other. The housing is divided into two separate compartments having independent water-tight integrity. That is, the portions of the GFCI contained within collar 34 and cap 42 are rendered waterproof by the sealed engagement of line cord 12 with grommet 46, of lip 44 of cap 42 with grommet 46, and by the engagement of O-ring 52 between collar 34 and cap 42. The portions housed by body member 132 are waterproof due to the sealing engagement of O-ring 138 between cover assembly 26 and body member 132, and gasket 140 between plug assembly 94 and collar 136 of the body member, thereby sealing the two openings of the body member.

Module 10 may be packaged and sold as a separate product, for attachment to a line cord by the purchaser and insertion in an electric receptacle when ready for use. The design of module 10 is such that virtually any purchaser of such equipment will be able to make the necessary connections of the line cord wires to the terminals on the front cover assembly 26 simply by manually removing cap 42 from its threaded connection with collar 34, passing the line cord through grommet 46, effecting connection of the line cord wires to the proper terminals, and replacing the cap on the collar. The only tool required is an ordinary screwdriver and both the wires (insulation) and terminals will be marked or color coded to indicate which wires are to be connected to which terminals.

If the operator should fail to replace cap 42 tightly enough to maintain the waterproof seal of cap 42 and collar 34, leakage should occur which produces an undesired ground path on the load (line cord) side of the module, this will appear as a ground fault and interrupt the circuit by opening the relay contacts in the indicated manner, thus providing the desired protection. Thus, GFCI module 10 may be utilized in outdoor or other potentially wet or moist environments without substantial danger of failure. It is also to be noted that grommets of the same external configuration, but of different internal diameter or, for that matter, other internal configuration, may be substituted for grommet 46 without changing any other component of module 10 to permit use with various line cords.

What is claimed is:

1. A substantially waterproof ground fault circuit interrupter module for attachment to the wires of a line cord extending from an electrical load, said module including plug blades for insertion in an electrical receptacle to connect said load to a power source, said module comprising:

(a) a hollow, one-piece body member enclosed on four sides and having openings at opposite ends;

(b) a plug subassembly including said blades and a solid plug member through which said blades extend in sealed engagement;

(c) a relay subassembly including a coil and movable contacts;

(d) a circuit board subassembly including ground fault responsive means;

(e) a cover subassembly including a wall member with a circular collar extending from one side thereof;

(f) means interconnecting said plug, relay, circuit board and cover subassemblies for mutual support to form a complete assembly;

(g) said assembly being inserted into said body member with said plug and wall members in sealing engagement with said openings at opposite ends of said body member, whereby said relay and circuit board subassemblies are entirely enclosed in a first, watertight compartment defined by said body, plug and wall members with said collar and blades extending outwardly in opposite directions therefrom;

(h) a cap member releasably engageable with said collar in covering relation to form a second compartment, said cap member having an opening therein for passage of a line cord;

(i) terminal means extending in sealing engagement through the portion of said wall member surrounded by said collar between said first and second compartments for attachment thereto of the wires of a line cord within said second compartment; and (j) a resilient grommet having an opening through which a line cord passes, said grommet being positioned within said second compartment in sealing engagement with said cap member opening to render said second compartment watertight when said module is attached to a line cord.

2. The invention according to claim 1 and further including an annular spacer member positioned within said second compartment, said grommet having one end seated on said spacer member and the other end compressed against the interior of said cap about the periphery of said opening therein when said cap is fully engaged with said collar.

3. The invention according to claim 2 wherein said grommet and spacer member may be slid on and off a line cord when the latter is disconnected from said terminals without removing or disconnecting other elements.

4. The invention according to claim 1 wherein said plug subassembly is physically connected and supported with respect to others of said subassemblies only by wiring connections.

5. The invention according to claim 1 and further including test and reset switch means for said ground fault responsive means mounted on said circuit board subassembly, actuating means for each of said switch means extending from within said first compartment through said wall member to terminal ends, and a pair of flexible rubber boots each having a portion wherein said terminal ends of the respective actuating means are engaged and supported, said rubber boots being manually engageable exteriorly of said wall member for movement of said actuating means to actuate said switch means.

6. The invention according to claim 5 wherein said rubber boots are press fitted in respective openings in said wall member with peripheral portions of said boots extending into said first compartment.

* * * * *